United States Patent [19]

Sarin et al.

[11] Patent Number: 4,957,780
[45] Date of Patent: Sep. 18, 1990

[54] INTERNAL REACTOR METHOD FOR CHEMICAL VAPOR DEPOSITION

[75] Inventors: Vinod K. Sarin, Lexington, Mass.; Charles D'Angelo, Southboro; Helen E. Rebenne, Westboro, all of Mass.

[73] Assignee: GTE Laboratories Incorporated, Waltham, Mass.

[21] Appl. No.: 407,980

[22] Filed: Sep. 15, 1989

Related U.S. Application Data

[60] Division of Ser. No. 206,400, Jun. 14, 1988, Pat. No. 4,890,574, which is a continuation-in-part of Ser. No. 5,003, Jan. 20, 1987, Pat. No. 4,751,109.

[51] Int. Cl.$^5$ ............................................. C23C 16/00
[52] U.S. Cl. ................................ 427/255.2; 427/255.3; 427/255
[58] Field of Search .................... 427/255.2, 255.3, 255

[56] References Cited

U.S. PATENT DOCUMENTS

| | | | |
|---|---|---|---|
| 3,461,004 | 8/1969 | Lochner et al. | 427/255.2 |
| 3,489,621 | 1/1970 | Sirtl | 427/255.2 |
| 3,563,816 | 2/1971 | Iida et al. | 427/255.2 |
| 3,574,006 | 4/1971 | Dersin et al. | 427/255.2 |
| 3,658,577 | 4/1972 | Wakefield | 427/255.2 |
| 4,000,716 | 1/1977 | Kurata et al. | 118/666 |
| 4,269,899 | 5/1981 | Fuyama et al. | 428/457 |
| 4,314,873 | 2/1982 | Wieder | 156/610 |
| 4,569,862 | 2/1986 | Arai et al. | 427/255.2 |
| 4,575,464 | 3/1986 | Grain | 427/255.2 |
| 4,686,117 | 8/1987 | Arai et al. | 427/255.2 |
| 4,687,684 | 8/1987 | Restall et al. | 427/255.2 |
| 4,717,443 | 1/1988 | Greene et al. | 427/255.2 |
| 4,786,526 | 11/1988 | Arai et al. | 427/255.2 |

Primary Examiner—Norman Morgenstern
Assistant Examiner—Sadie Childs
Attorney, Agent, or Firm—Frances P. Craig

[57] ABSTRACT

A chemical vapor deposition process in which an internal reactor is disposed within a chemical vapor deposition reactor including means for enclosing a reaction chamber and means for heating the reaction chamber. The position at which the internal reactor is disposed relative to the heating means is selected to provide control of the temperature within the internal reactor. At least two solid precursor materials are placed in the internal reactor and are contacted with at least one precursor gas, reactive with the solid precursor materials to produce at least two reactant gases. These gases are directed to the reaction chamber to react with one or more additional reactants.

6 Claims, 2 Drawing Sheets

4,957,780

INTERNAL REACTOR METHOD FOR CHEMICAL VAPOR DEPOSITION

REFERENCE TO RELATED APPLICATIONS

This is a divisional of copending application Ser. No. 07/206,400 filed June 14, 1988, and issued Jan. 2, 1990 as U.S. Pat. No. 4,890,574. U.S. Pat. No. 4,890,574 is a Continuation-in-Part of U.S. patent application Ser. No. 005003, filed on 1/20/87 and issued June 14, 1988 as U.S. Pat. No. 4,751,109, and is also related to U.S. patent applications Ser. Nos. 07/206,401 and 07/206,399, filed concurrently herewith and incorporated herein by reference.

FIELD OF THE INVENTION

This invention relates to chemical vapor deposition (CVD) apparatus, and more particularly to such apparatus incorporating an internal reactor for in-situ generation of source gases for the CVD reaction.

BACKGROUND OF THE INVENTION

The introduction of gaseous source materials into chemical vapor deposition (CVD) reactors is a critical part of the CVD process. If the reactant is stable in gaseous form at operating pressures and temperatures, it can be metered into the CVD reactor directly from a storage container. If it is stable in liquid form, it can be evaporated at a controlled rate to produce the gaseous reactant for the CVD process.

In many cases, however, a gaseous or liquid source is either not available or not useable in the process desired. Hence, a volatile source is often generated by chemical reaction or volatilization. At present, chemical generation of a volatile source gas is accomplished commercially by the use of a reactor external to the CVD apparatus. This technique offers the advantage of independent control of the source gas reaction conditions, but requires the use of an additional furnace and heated lines to the CVD reactor to prevent precipitation of the gaseous product. Apart from the added expense, this method has inherent problems, in that precipitate can build up in and eventually clog gas lines, or can disrupt the overall process.

The invention described herein and recited in the appended claims controls such precipitate build-up by providing one or more containers, or internal reactors, disposed within the CVD reactor for the generation of one or more source gases. The internal reactor utilizes heat from the CVD furnace, thereby reducing cost and simplifying the overall process. Additionally, such an internal reactor assembly can be used to generate simultaneously any number of source gases while controlling the relative quantity of each gas produced. The simultaneous generation, in turn, contributes to pre-mixing of the source gases, and results in the growth of materials, for example composite or multiphase coatings, of improved quality.

SUMMARY OF THE INVENTION

A chemical vapor deposition reactor according to one aspect of the invention includes means enclosing a reaction chamber, means for heating the reaction chamber, and at least one internal reactor disposed within the enclosing means. The internal reactor includes means for containing a solid precursor material; first gas inlet means for directing at least one precursor gas reactive with the solid precursor material to produce at least one first reactant gas, from a source outside the enclosing means to the containing means; and gas outlet means to allow the at least one first reactant gas to flow from the containing means to react with one or more additional reactants in the reaction chamber. The relative positions of the containing means and the heating means are selected to permit reaction temperatures both within the reaction chamber and within the containing means suitable for reactions occurring therein.

An internal reactor according to another aspect of the invention, is useful to produce at least one first reactant gas for a chemical vapor deposition reaction within a reaction chamber of a chemical vapor deposition reactor including means for enclosing the reaction chamber and means for heating the reaction chamber. The internal reactor includes means for containing a solid precursor material; gas inlet means for directing at least one precursor gas, reactive with the solid precursor material to produce the at least one first reactant gas, from a source outside the enclosing means to the containing means; and gas outlet means to allow the at least one first reactant gas to flow from the containing means to react with at least one second reactant in the reaction chamber. The internal reactor is positionable within the enclosing means at a position relative to the heating means selected to permit temperature control within the containing means at a level suitable for the production of the at least one first reactant gas.

A chemical vapor deposition process according to yet another aspect of the invention involves disposing an internal reactor within a chemical vapor deposition reactor comprising means for enclosing a reaction chamber and means for heating the reaction chamber. The internal reactor is disposed at a position relative to the heating means selected to provide control of the temperature within the internal reactor. A solid precursor material is placed in the internal reactor, and is contacted with at least one precursor gas, reactive with the solid precursor material to produce at least one first reactant gas. The first reactant gas is directed to the reaction chamber to react with one or more additional reactants.

BRIEF DESCRIPTION OF THE DRAWING

For a better understanding of the present invention, together with the objects, advantages, and capabilities thereof, reference is made to the following disclosure and appended claims, taken together with the drawings, of which:

DETAILED DESCRIPTION OF THE INVENTION

Figure 1:
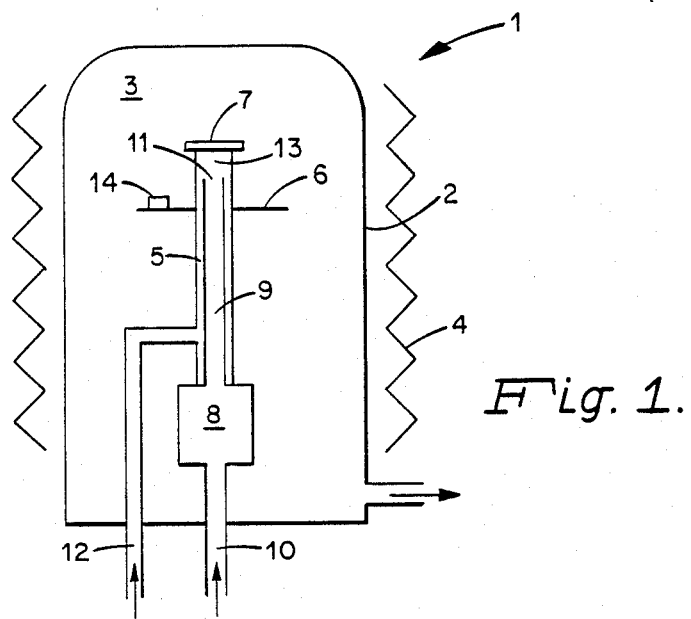
FIG. 1 is a schematic cross-sectional view of a CVD reactor, incorporating an internal reactor embodying the invention.

An illustrative CVD reactor 1 according to the present invention is shown in FIG. 1. Reactor dome 2 of reactor 1 encloses reaction chamber 3, and is heated by heating means 4. Gas inlet means 5 supports substrate holder 6, and directs reactant gases to reaction chamber 3 through gas distributor 7. Internal reactor 8 operationally communicates with gas inlet means 5 through coaxial tube 9, and with a source (not shown) of a precursor halide gas through inlet tube 10. The flow of the precursor gas is controlled by known means (not shown). Coaxial tube 9 is disposed within and is coaxial with gas inlet means 5, outlet 11 of coaxial, tube 9 being disposed within gas inlet means 5 near gas distributor 7. Auxiliary inlet tube 12 operationally communicates with gas inlet means 5, joining gas inlet means 5 at a point along the length of coaxial tube 9 and upstream of coaxial tube outlet 11. Auxiliary inlet tube 12 also communicates with a source or sources (not shown) of additional reactant gases, the flow(s) of which are controlled by known means (not shown).

In an illustrative process according to still another aspect of the invention, a precursor halide gas, normally mixed with a carrier gas, enters internal reactor 8 through inlet tube 10, and flows through and reacts with one or more metal reactants, conveniently in particulate form, contained in internal reactor 8 to form one or more metal halides. The metal halide gas flows through coaxial tube 9 entering gas inlet means 5 at outlet 11. Additional source gases, for example oxygen sources such as carbon dioxide and water or a nitrogen source such as nitrogen or ammonia, normally mixed with a carrier gas such as argon, flow through auxiliary tube 12 to gas inlet means 5, mixing with the metal halide gas at mixing portion 13 of gas inlet means 5 between outlet 11 and gas distributor 7. Coaxial tube outlet 11 is disposed sufficiently close to gas distributor 7 to provide some preliminary mixing of the reactant gases while preventing premature reaction of the gases to form a precipitate or deposition of, for example, metal oxides or nitrides within inlet means 5 or on gas distributor 7. The reactant gas mixture flows through gas distributor 7 to reaction chamber 3, depositing the desired reaction product, e.g. metal oxide or nitride, on one or more substrates 14 disposed on substrate holder 6. The remaining gas mixture exits reaction chamber 3 through outlet 15.

Figure 2:
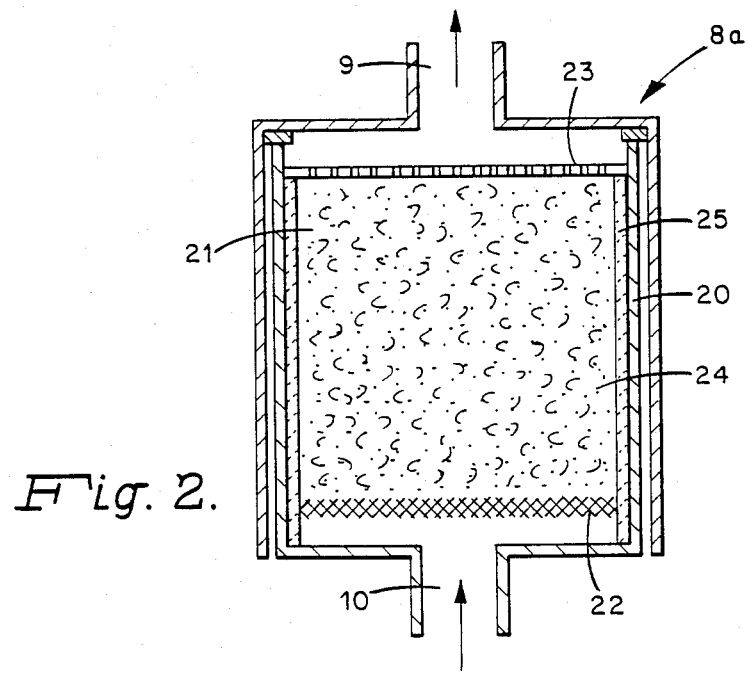
FIG. 2 is a schematic cross-sectional view of the internal reactor of FIG. 1.

FIG. 2 illustrates one embodiment of internal reactor 8 in more detail. In FIG. 2, internal reactor 8a includes reaction shell 20 enclosing reaction chamber 21, and operationally communicating with coaxial tube 9 and inlet tube 10. Within shell 20, gas distributor 22 and screen 23 enclose and contain one or a mixture of two or more particulate solid source metals 24. Gas distributor 22 is formed from, for example, a perforated or gas permeable material to distribute gases entering reaction chamber 21 from inlet tube 10 throughout metal particulates 24. Screen 23 downstream of the metal particulates prevents entrainment of the particulates in the gases exiting reaction chamber 21. Optionally, insulating sleeve 25 may be provided within shell 20 of a material selected to prevent chemical attack on shell 20 and/or to assist in control of the reaction temperature within reaction chamber 21.

The term "metal" or "metals", as used throughout the specification and claims of this application, refers to a charge of metal disposed as a precursor reactant in the internal reactor, includes a single metal element, an alloy or solid solution of two or more metals, a mixture of two or more metals, or a precursor or precursors of the metal or metals in the forms described above. Additionally or alternatively, the internal reactor according to the invention may contain solid non-metallic reactant(s), conveniently in particulate form, for example silicon or boron, or solid solutions, mixtures, or precursors of non-metallic reactants, for reaction with gaseous precursors of various types to form a reactant gas for use in a CVD process within the CVD reactor. Normally, the solid precursor reactant, metallic or non-metallic, is in finely divided form, for example in particulate form, to maximize surface area available for contact by the precursor gas. Other forms, however, are within the scope of the invention.

In operation, a precursor halide gas, normally mixed with a carrier gas, enters reaction chamber 21 through inlet tube 10 and is distributed by gas distributor 22 across the entire cross section of the reaction chamber. As the precursor halide gas flows through particulate solid source metal(s) 24, the halide gas reacts with the one or more metals to form one or more metal halides, which are gases at the reaction temperature. The metal halide gases flow through screen 23 and exit reaction chamber 21 through coaxial tube 9.

Referring to FIG. 1, the metal halide gas exits coaxial tube 9 at outlet 11, entering portion 13 of gas inlet means 5 and mixing with the additional source gases described above. The gas mixture exits gas inlet means 5 through gas distributor 7, entering reaction chamber 3, and depositing a layer of product, for example a metal oxide or nitride, on substrate 14 within reaction chamber 3, as described above.

Figure 4:
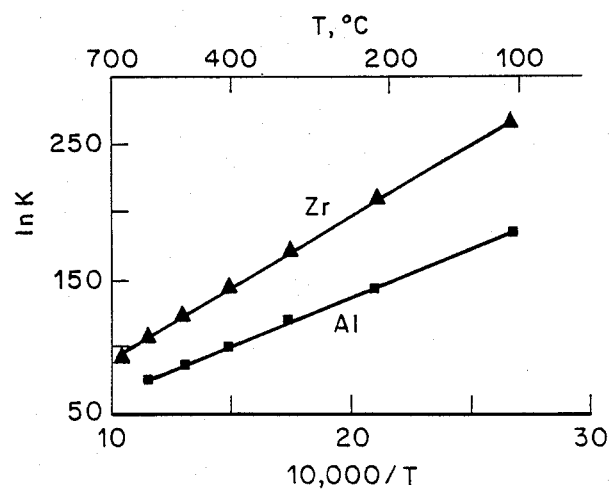
FIG. 4 is a graphical representation illustrating the variation of the reactivity of some candidate metals with chlorine with increasing temperature.

The temperature within internal reactor 8 may be controlled by its position within reactor dome 2 relative to heating means 4. Thus, in reactor 1 of FIG. 1, raising internal reactor 8 to a position higher within the reactor dome (i.e. more fully within the reactor portion surrounded by heating means 4) would result in a relatively higher internal temperature within internal reactor 8, while lowering the internal reactor (i.e. away from heating means 4) would result in a lower internal reactor temperature. The optimum position for internal reactor 8 within reactor dome 2 to achieve the optimum reaction temperature for various reactants and relative proportions of reactants may be empirically determined, for example by theoretically determining the optimum reaction temperature from the reaction kinetics, if known. For example, FIG. 4 illustrates the variation of reactivity of aluminum and zirconium with chlorine with increasing temperature. Minimal experimentation is then needed to determine the optimum position for the internal reactor.

Figure 3:
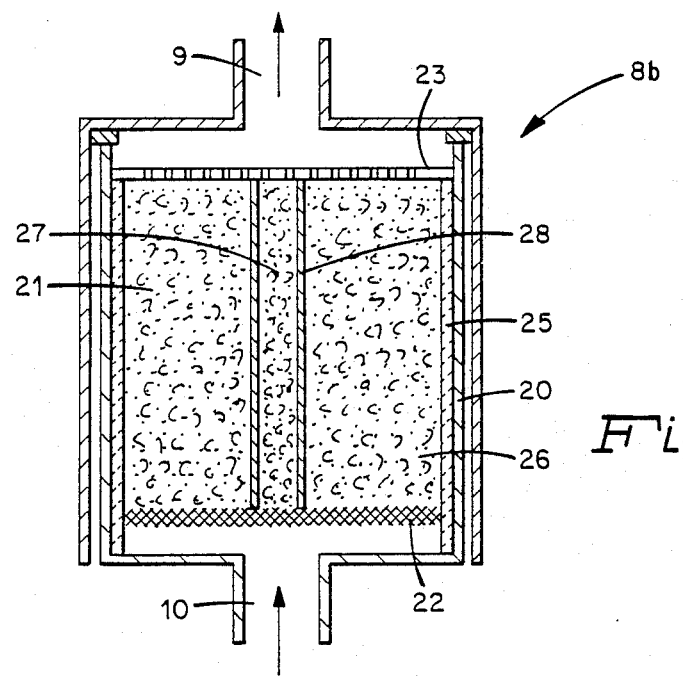
FIG. 3 is a schematic cross-sectional view of an alternate embodiment of an internal reactor embodying the invention.

An alternative embodiment of internal reactor 8 is illustrated in FIG. 3. Internal reactor 8b of FIG. 3 includes shell 20 enclosing reaction chamber 21 and operationally communicating with coaxial tube 9 and inlet tube 10 as described above for internal reactor 8a. The particulate metal charge is enclosed by gas distributor 22 and screen 23, and optionally by sleeve 25, also as described above for internal reactor 8a. In internal reactor 8b, two or more metals or mixtures of metals, e.g. metal 26 and metal 27, are isolated from one another, metal 27 being disposed within tube 28, which extends from gas distributor 22 to screen 23, preventing contact between metal 26 and 27, but permitting gas flow through metal 27. Tube 28 is conveniently of a ceramic material resistant to chemical attack under the conditions existing within reaction chamber 21.

In operation, the precursor halide gas enters reaction chamber 21 through inlet tube 10 and is distributed by gas distributor 22 across the entire cross section of reaction chamber 21. A portion of the halide gas passing through gas distributor 22 enters tube 28 to react with particulate metal 27, while the remainder of the precursor halide gas flows outside of tube 28 to react with metal particulate 26. The separate metal halide products resulting from the reactions flow upward through screen 23 to mix and exit reaction chamber 21 through coaxial tube 9. The remainder of the process is the same as that described above with reference to FIGS. 1 and 2.

In its simplest embodiment i.e. that illustrated in FIG. 2, the internal reactor according to the invention may be used to produce a monolithic, single component coating, e.g. alumina or zirconia, on a substrate. A single particulate precursor metal, e.g. aluminum or zirconium, is placed within internal reactor 8a for reaction with the halide precursor to form a metal halide source gas.

Alternate embodiments (not illustrated) of the internal reactor according to the invention include, but are not limited to the following:

A. Two or more metals contained within internal reactor 8 are isolated from one another within the internal reactor. A plurality of inlet tubes similar to tube 10 provide precursor halide gas flow to the various isolated charges, with the advantage that the flow of precursor gases may be separately controlled by known means.

B. Separate internal reactors each containing a different metal charge are separately interconnected with a source of precursor halide gas, and the flow of precursor halide to each separately controlled by known means. Each internal reactor may be disposed within the CVD reactor, as described above, at a position relative to heating means 4 to provide an internal temperature suitable for the reaction taking place therein. Also, the production of halides of different metals may be sequential in this embodiment, to produce a layered coating on a substrate.

C. In any of the above described embodiments, separate outlets may direct the gaseous metal halide products toward reaction chamber 3, either with all metal halides passing through coaxial tube 9, or one or more metal halides entering reaction chamber 3 by other means.

The reactor according to the invention is particularly useful for the processes described in U.S. patent application Ser. No. 005,003, of which this application is a Continuation-In-Part; and in U.S. Pat. Nos. 4,701,384, 4,702,970, and 4,745,010; and in U.S. patent application Ser. No. 005,002, filed Jan. 20, 1987, all incorporated herein by reference.

The process described in U.S. patent application Ser. No. 005,003 is a typical example of processes for which the reactor according to the present invention is particularly useful. This process involves deposition of an adherent, wear resistant, two or more phase composite, oxide-based coating on a ceramic substrate, for example silicon nitride or a related material. The outstanding properties of the coating, i.e. adherence to the substrate, wear resistance, high temperature resistance, and resistance to chemical attack or breakdown at high temperatures, are a result of the achievement of a second phase of discrete particles of alumina, zirconia, or yttria, or a combination of these, within an alumina, zirconia, or yttria matrix, the particles and the matrix being of different materials. A preferred composite coating comprises discrete particles of zirconia evenly distributed throughout an alumina matrix. In order to produce the discrete particles of the second phase zirconia within the alumina matrix, it is important to control the relative deposition by controlling such process parameters as the relative gas flow rates.

The process for depositing the above described alumina/zirconia composite ceramic coating on a cemented carbide substrate involves passing over the substrate a mixture of an aluminum halide vapor and a zirconium halide vapor, for example aluminum chloride and zirconium chloride, and other reactant gases, including an oxygen source such as carbon dioxide or water, normally mixed with a reducing gas such as hydrogen, and a carrier gas such as argon. The temperature within reaction chamber 3 is about 900°–1200° C., and the pressure is between about 1 torr and about ambient pressure. The partial pressure ratios, the flow rate of the gas mixture, and the length of time of the gas flow is sufficient to deposit a continuous, fully dense, adherent, wear resistant layer of alumina about 0.1–20 microns thick on the substrate, an additional phase of zirconia being dispersed as discrete particles within the continuous alumina layer.

The following are examples of how the reactor according to the invention may be used to produce an alumina/zirconia composite coating as described in the above-referenced patents and applications. These examples are intended only as illustrative and not limiting.

A. A charge of aluminum is placed within internal reactor 8a (FIG. 2). One or more silicon nitride cutting tool substrates is placed on substrate holder 6. Reaction chamber 3 (FIG. 3) is heated to the desired reaction temperature, for example 1200° C. A halide precursor gas, for example $Cl_2$ or HCl mixed with argon, enters reaction chamber 21 through inlet 10, reacts with the aluminum charge to produce chloride gas, which in turn flows with the argon carrier through coaxial tube 9 toward reaction chamber 3. The flow rate of the halide precursor and the surface area of the aluminum are selected to provide the aluminum chloride partial pressure desired for the deposition reaction. Zirconium chloride enters reaction chamber 3 from a source outside the reactor, for example through coaxial tube 9. The remaining source gases, for example hydrogen and $CO_2$, mixed with argon as a carrier, enter the reactor through auxiliary inlet tube 12, mixing with the halide gases in portion 13 of gas inlet means 5. The gas mixture enters reaction chamber 3 through gas distributor 7, contacting the substrates and reacting to form an alumina/zirconia composite coating thereon. Zirconium halide gas may be metered to provide the relative aluminum halide and zirconium halide partial pressures desired, or the zirconium halide may be pulsed into the reactor as described in the above-referenced patents and applications.

B. The arrangement and process are as described above at A, except the zirconium halide is produced within reactor 1 by providing a second internal reactor, which may advantageously be placed further away from heating means 4 than internal reactor 8. A zirconium charge is placed within the second internal reactor, and a halide precursor gas, as described above, enters the second internal reactor to react with the zirconium to produce zirconium halide gas. The halide precursor flow rate and the zirconium surface area are selected to provide the relative partial pressure as described above for the aluminum halide gas. The zirconium halide gas may then be directed to the reactor, for example through a tube interconnecting the second internal reactor with the coaxial tube 9.

C. The arrangement and process are as described above at B, except the zirconium metal is mixed with the aluminum in internal reactor 8a. The halide precursor reacts with both the aluminum and the zirconium to produce the desired metal halide gas mixture. The surface areas of the aluminum and zirconium are selected to produce the desired relative partial pressures of the metal halides.

D. The arrangement and process are as described above at C, except internal reactor 8b, shown in FIG. 3, is used. The zirconium is placed within tube 28, the aluminum outside of tube 28. The precursor halide flows through both metals, and the resulting halides mix in coaxial tube 9.

The above examples are illustrative of possible reactor arrangements and processes, and are not intended to be limiting in any way. Other arrangements and processes are also possible within the invention. For example: A third metal such as yttrium may be included, separately or mixed with one or both of the above metals. Other reactants may be substituted for the oxidizing gases described above, e.g. nitriding gases such as $N_2$ or $NH_3$ and hydrogen. Alternatively, solid reactants may be arranged within the CVD reactor to react with the reactant gas produced in the internal reactor. Other metals or non-metals may be substituted for the metals described above, e.g. other transition metals of groups IIIB, IVB, VB, or VIB; or gallium, indium, silicon, boron, phosphorous, or sulphur. Also, CVD processes other than the coating processes described above, may be carried out in the reactor, for example doping processes or growth of powders or whiskers, by changing the process parameters to those suitable for such processes.

The following Examples are presented to enable those skilled in the art to more clearly understand and practice the present invention. These Examples should not be considered as a limitation upon the scope of the present invention but merely as being illustrative and representative thereof.

EXAMPLES

An excess of metal chips, −6 to +20 mesh, was loaded into an internal reactor in a CVD reactor similar to that illustrated in FIG. 1. The reactor was loaded with substrates supported by a substrate holder, evacuated to about 100 torr, then heated under low pressure, while being flushed with flowing hydrogen, to increase outgassing before deposition. The halide precursor gas was $Cl_2$ in an Ar and $H_2$ carrier. Argon was used as the carrier for the additional reactant gases. Following the deposition procedure, the reactor was cooled at the deposition pressure and while being flushed with hydrogen, to about 1000° C., then under ambient pressure and flowing Ar to room temperature.

Example 1—Formation of an Aluminum Nitride Coating on Silicon Nitride-Based Substrates:

| Metal chips: | Al |
| --- | --- |
| Deposition T: | 975° C. |
| Internal reactor T: | 200–400° C. |
| Deposition P: | 100 torr |
| Gas flows- | |
| $Cl_2$: | 65 cc/min. |
| Ar: | 3500 cc/min. |
| $NH_3$: | 750 cc/min. |
| $H_2$: | 4500 cc/min. |
| Deposition: | 180 min. |

Example 2—Formation of an Alumina-Zirconia Composite Coating on WC-Co Substrates:

| Metal chips: | Al and Zr |
| --- | --- |
| Al/Zr wt. ratio, start: | 15 |
| Al/Zr wt. ratio, consumed: | 6.8 |
| Deposition T: | 1000° C. |
| Deposition P: | 75 torr |
| Gas flows- | |
| Ar: | 3500 cc/min. |
| $CO_2$: | 230 cc/min. |
| $H_2$: | 4500 cc/min. |
| Deposition time: | 180 min. |

Example 3—Formation of an Alumina-Zirconia Composite Coating on Silicon Nitride-Based Substrates:

Zirconium chips were placed in a refractory tube within the internal reactor. Aluminum chips surrounded the tube. The halide precursor was dispersed to flow through both charges.

| Al/Zr wt. ratio, start: | 15 |
| --- | --- |
| Al/Zr wt. ratio, consumed: | 4.6 |
| Deposition T: | 1000° C. |
| Deposition P: | 75 torr |
| Gas flows: | |
| $Cl_2$: | 65 cc/min. |
| Ar: | 3500 cc/min. |
| $CO_2$: | 300 cc/min. |
| $H_2$: | 4500 cc/min. |
| Deposition Time: | 180 min. |

Example 4—Formation of an Alumina-Zirconia Composite Coating over an AlN Intermediate Layer on Silicon Nitride-Based Substrates:

The deposition process was performed in two steps. First, aluminum chips were placed in the internal reactor.

| Metal chips: | Al |
| --- | --- |
| Metal consumed: | 5.7 gm |
| Deposition T: | 975° C. |
| Deposition P: | 75 torr |
| Gas flow- | |
| $Cl_2$: | 65 cc/min. |
| Ar: | 3000 cc/min. |
| $NH_3$: | 750 cc/min |
| $H_2$: | 4300 cc/min. |
| Deposition: | 120 min. |

Zirconium chips were then placed in a refractory tube within the internal reactor. Aluminum chips surrounded the tube. The halide precursor was dispersed to flow through both charges.

| Al/Zr wt. ratio, start: | 15 |
| --- | --- |
| Al/Zr wt. ratio, consumed: | 4.6 |
| Deposition T: | 1000° C. |
| Deposition P: | 75 torr |
| Gas flows: | |
| $Cl_2$: | 65 cc/min. |
| Ar: | 3500 cc/min. |
| $CO_2$: | 300 cc/min. |

-continued

| | |
|---|---|
| H₂: | 4500 cc/min. |
| Deposition Time: | 180 min. |

While there has been shown and described what are at present considered the preferred embodiments of the invention, it will be obvious to those skilled in the art that various changes and modifications can be made herein without departing from the scope of the invention as defined by the appended claims.

We claim:

1. A chemical vapor deposition process comprising the steps of:
    disposing an internal reactor within a chemical vapor deposition reactor comprising means for enclosing a reaction chamber and means for heating the reaction chamber, at a position relative to the heating means selected to provide control of the temperature within the internal reactor;
    placing at least first and second solid precursor materials in the internal reactor;
    placing a substrate in the reaction chamber;
    contacting the solid precursor materials with at least one precursor gas, reactive with the solid precursor materials to produce at least two first reactant gases; and
    directing the at least two first reactant gases to the reaction chamber to react with one or more additional reactants to form a product, and to deposit a layer of the product on the substrate.

2. A process in accordance with claim 1 wherein the first and second solid precursor materials are selected from the group consisting of aluminum, zirconium, and yttrium; mixtures and solid solutions thereof; and precursors thereof.

3. A process in accordance with claim 1 wherein the first and second solid precursor materials are selected from the group consisting of metals of group IIIB, IVB, VB, VIB, and VIB of the periodic table of the elements; alloys, mixtures, and solid solutions thereof; and precursors thereof.

4. A process in accordance with claim 1 wherein the first and second solid precursor materials are selected from the group consisting of gallium, indium, silicon, boron, phosphorus, sulphur, and arsenic; and mixtures and precursors thereof.

5. A process according to claim 1 wherein the precursor gas is a halide selected from the group consisting of chlorine and HCl.

6. A process according to claim 1 wherein the one or more additional reactants is selected from the group consisting of $CO_2$ and $H_2$, $H_2O$, $CO$ and $H_2$, $N_2$, $NH_3$, and mixtures thereof.

* * * * *